(12) United States Patent
Takeda

(10) Patent No.: US 6,569,251 B1
(45) Date of Patent: *May 27, 2003

(54) DETERGENT FOR LITHOGRAPHY

(75) Inventor: Takashi Takeda, Ogasa-gun (JP)

(73) Assignee: Clariant Finance (BVI) Limited, Tortola (VG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/242,790

(22) PCT Filed: Jun. 17, 1998

(86) PCT No.: PCT/JP98/02666

§ 371 (c)(1),
(2), (4) Date: Feb. 23, 1999

(87) PCT Pub. No.: WO98/59363

PCT Pub. Date: Dec. 30, 1998

(30) Foreign Application Priority Data

Jun. 24, 1997 (JP) .............................. 9-167593

(51) Int. Cl.[7] .............................. C11D 3/44; C11D 3/20; C23G 1/24
(52) U.S. Cl. ..................... 134/2; 510/169; 510/171; 510/407; 510/505; 510/108; 510/201
(58) Field of Search ................... 510/169, 171, 510/407, 405, 505, 506, 108, 201; 134/2

(56) References Cited

U.S. PATENT DOCUMENTS

| | | | |
|---|---|---|---|
| 4,956,115 A | * | 9/1990 | Van De Mark ............. 252/170 |
| 4,983,490 A | | 1/1991 | Durham ..................... 430/169 |
| 5,612,303 A | | 3/1997 | Takayanagi et al. ........ 510/174 |
| 5,643,860 A | * | 7/1997 | Mella ......................... 510/245 |
| 5,846,690 A | * | 12/1998 | Padmanaban et al. ... 430/284.1 |
| 6,187,729 B1 | * | 2/2001 | Hayes et al. ................. 510/166 |

OTHER PUBLICATIONS

Derwent Abstract—EP 629671.
Derwent Abstract—JP 8123043.
Derwent Abstract—JP 7219240.
Derwent Abstract—JP 7120937.
Abstract—JP 04049938.

\* cited by examiner

*Primary Examiner*—Cynthia H. Kelly
*Assistant Examiner*—Dawn Garrett
(74) *Attorney, Agent, or Firm*—Krishna Banerjee; Sangya Jain

(57) ABSTRACT

The present invention relates to a cleaner for lithography which is excellent in the ability to dissolve a resist and highly safe to the human body and which can be used usefully to clean a coater such as in a coater cup, to remove an unnecessary resist from a substrate when or after coating of a resist, to remove the resist from the substrate after the object using the resist was achieved, and to clean and rinse the substrate after removal of the resist. The cleaner for lithography comprises a homogeneous solution of at least one organic solvent selected from the group consisting of propylene glycol alkyl ether, propylene glycol alkyl ether acetate, ethylene glycol alkyl ether, ethylene glycol alkyl ether acetate, acetic acid alkyl ester, propionic acid alkyl ester, alkoxypropionic acid alkyl ester, lactic acid alkyl ester, aliphatic ketone, and alkoxybutanol and at least one selected from alcohols having alkyl group with 1 to 4 carbon atoms.

6 Claims, No Drawings

DETERGENT FOR LITHOGRAPHY

FIELD OF THE INVENTION

The present invention relates to a cleaner for lithography which is used for dissolving or removing a resist etc. and in particular to a cleaner for lithography which can be used usefully to clean a coater such as in a coater cup, to remove an unnecessary resist from a substrate when or after coating of a resist, to remove the resist from the substrate after the object using the resist was achieved, and to clean or rinse the substrate after removal of the resist.

BACKGROUND OF THE INVENTION

For production of integrated circuit elements, color filters, liquid crystal display elements, etc., lithography using resists are conventionally used. For example, in production of integrated circuit elements etc. by use of lithography, an anti-reflective coating is formed as necessary on a substrate, then a positive- or negative-working resist is applied thereto, the solvent is removed by baking, an anti-reflective coating is formed as necessary on the resist layer which is then exposed to ultraviolet rays, deep ultraviolet rays, electron beams, X-rays, etc., followed baking as necessary and development to form a resist pattern. Thereafter, baking is conducted as necessary, and the substrate is subjected to etching etc., and the resist is generally removed.

For coating of the resist, various methods such as spin coating method, roller coating method, reverse roller coating method, cast coating method, doctor coating method, dip coating method, etc. are used. For example, in production of integrated circuit elements, spin coating method is mainly used as a method of coating a resist. In spin coating method, a resist solution is dropped on a substrate, and due to the rotation of the substrate, this dropped resist solution is cast in the direction toward the outer periphery of the substrate so that an excess of the resist solution is removed by scattering from the outer periphery of the substrate, whereby a resist layer having a desired film thickness is formed. A part of the excess resist remains in a coater cup and solidified with time as the solvent is evaporated. The solidified material becomes fine powder which is then scattered to adhere to the substrate, thus causing resist pattern defects. To prevent this phenomenon, it is necessary to clean the coater cup every a few to dozens of substrates. Further, in the case where a resist layer having a desired thickness is formed by spin coating method on the substrate, there is the disadvantage that a part of the resist solution moves further to the back of the substrate, or the resist solution remains thickly (i.e. beads are formed) on the outer periphery of the substrate, and therefore it is necessary to remove the unnecessary resist or the beads from the side, the outer periphery or the back of the substrate. Further, even in other coating methods than spin coating method, adhesion of a resist to an improper portion occurs as is the case with spin coating. After the substrate is subjected to etching etc., the resist is generally removed and even in this removal step, the resist is dissolved and removed usually by means of an organic solvent.

The surface of the substrate from which the resist was removed by dissolution is made contaminant-free by generally cleaning using purified water etc., thus removing fine particles remaining on the surface of the substrate, followed by the subsequent step. If the solvent used for removal of the resist is a water-insoluble organic solvent or an amine type organic solvent, the substrate is often rinsed with a clean, water-soluble organic solvent rather than cleaning with purified water immediately after the step of removing the resist. The reason for this is that if a water-insoluble organic solvent is used as the liquid for removal of the resist, the resist dissolved in this solvent is prevented from adhering again to the substrate by preventing it from being precipitated in the solvent upon mixing with purified war, and that the water-insoluble organic solvent present on the surface of the substrate is once replaced by a water-soluble organic solvent to facilitate replacement by purified water. If an amine type organic solvent is used as the liquid for removal of the resist, this solvent remains in purified water to make it alkaline whereby the metallic substrate is prevented from corroding.

After the coating step is finished, the coater should be cleaned for subsequent use or as a coater used again for other materials, or if an anti-reflective coating is resent between the substrate and the resist layer, the anti-reflective coating may be removed with a solvent as necessary after the resist pattern is formed.

As described above, a cleaner is used in various steps in lithography process, and as this cleaner, a wide variety of cleaners consisting of organic solvents are known (e.g. Japanese Patent Application Publication No. 4-49938).

However, some conventional cleaners require much time or should be used in a large amount because of their poor ability to dissolve the resist and some are very toxic, so there is no cleaner satisfying both excellent solvent properties and safety to the human body, and therefore there is strong demand for a cleaner satisfying both solvent properties and safety to the human body. Although the production of integrated circuit elements has been described above, the above description applies not only to the production of integrated circuit elements but also to the production of color filters, liquid crystal elements, etc.

The object of the present invention is to provide a cleaner for lithography which is free of the aforementioned problems, that is, a cleaner which can be used usefully to clean a coater such as in a coater cup, to remove an unnecessary resist from a substrate when or after coating of a resist, to remove the resist from the substrate after the object using the resist was achieved, to clean and rinse the substrate after removal of the resist, which has a high solubilizing agility to permit sufficient cleaning to be effected rapidly in a small amount of the cleaner, and which is highly safe to he human body.

DISCLOSURE OF THE INVENTION

As a result of their eager research, the present inventor found that the above object can be achieved by using a homogeneous mixture of specific organic solvents and specific alcohols as a cleaner for lithography, to work out the present invention.

That is, the present invention relates to a cleaner for lithography which comprises a homogeneous solution comprising at least one selected from highly safe organic solvents of Group A below and at least one selected from alcohols having alkyl group with 1 to 4 carbon atoms.

Group A
  propylene glycol alkyl ether
  propylene glycol alkyl ether acetate
  ethylene glycol alkyl ether
  ethylene glycol alkyl ether acetate
  acetic acid alkyl ester
  propionic acid alkyl ester alkoxypropionic acid alkyl ester lactic acid alkyl ester aliphatic ketone alkoxybutanol Another present invention relates to a cleaner for lithography which comprises a homogeneous solution comprising propylene glycol alkyl ether and at least one alcohol selected from alcohols having alkyl group with 1 to 4 carbons.

A further present invention relates to a cleaner for lithography which comprises a homogeneous solution comprising propylene glycol alkyl ether and at least one alcohol selected from alcohols having alkyl group with 1 to 4 carbons, wherein the propylene glycol alkyl ether is at least one selected from propylene glycol monomethyl ether, propylene glycol monoethyl ether and propylene glycol monopropyl ether, and the alcohol is at least one selected from ethanol, 1-propanol and 2-propanol.

An additional present invention relates to a cleaner for lithography which comprises a homogeneous solution comprising propylene glycol alkyl ether acetate and at least one alcohol selected from alcohols having alkyl group with 1 to 4 carbons.

Another further present invention relates to a cleaner for lithography which comprises a homogeneous solution comprising propylene glycol alkyl ether acetate and at least one alcohol selected from alcohols having alkyl group with 1 to 4 carbons, wherein the propylene glycol alkyl ether acetate is at least one selected from propylene glycol monomethyl ether acetate and propylene glycol monoethyl ether acetate, and the alcohol is at least one selected from ethanol, 1-propanol and 2-propanol.

A still further present invention relates to a cleaner for lithography which comprises a homogeneous solution comprising at least one organic solvent selected from ethylene glycol ethyl ether acetate, n-butyl acetate, methoxypropionic acid methyl ester, ethoxypropionic acid ethyl ester, 2-heptanone, methoxybutanol and ethyl lactate, and at least one alcohol selected from ethanol, 1-propanol and 2-propanol.

In the present invention, preferable solvents in Group A are as follows:

(1) propylene glycol alkyl ethers such as propylene glycol monomethyl ether, propylene glycol monoethyl ether, propylene glycol monopropyl ether, propylene glycol mono-n-butyl ether etc.;

(2) propylene glycol alkyl ether acetates such as propylene glycol monomethyl ether acetate, propylene glycol monoethyl ether acetate etc.;

(3) ethylene glycol alkyl ethers such as ethylene glycol monomethyl ether, ethylene glycol monoethyl ethylene glycol monopropyl ether etc.;

(4) ethylene glycol alkyl ether acetates such as ethylene glycol monomethyl ether acetate, ethylene glycol monoethyl ether acetate etc.;

(5) acetic acid alkyl esters such as propyl acetate, n-butyl acetate, n-amyl acetate etc.;

(6) propionic acid alkyl esters such as methyl propionate, ethyl propionate, propyl propionate, butyl propionate etc.:

(7) alkoxypropionic acid alkyl esters such as methoxypropionic acid methyl ester, ethoxypropinic acid ethyl ester, methoxypropionic acid ethyl ester, ethoxypropionic acid methyl ester etc.;

(8) lactic acid alkyl esters such as methyl lactate, ethyl lactate etc.;

(9) aliphatic ketones such as 2-butanone, 2-pentanone, 2-hexanone, 2-heptanone etc.;

(10) alkoxybutanols such as methoxybutanol, ethoxybutanol etc.

Particularly preferable solvents among those enumerated above are propylene glycol monomethyl ether, propylene glycol monoethyl ether, propylene glycol monopropyl ether, propylene glycol monomethyl ether acetate, propylene glycol monoethyl ether acetate, ethylene glycol monoethyl ether acetate, n-butyl acetate, methoxypropionic acid methyl ester, ethoxypropionic acid ethyl ester, ethyl lactate, 2-heptanone, and methoxybutanol.

The organic solvents in Group A can be used singly or in combination thereof. Preferable combinations of two or more organic solvents include a combination of a propylene glycol alkyl ether and a propylene glycol alkyl ether acetate, specifically a combination of propylene glycol monomethyl ether and propylene glycol monomethyl ether acetate.

Although alcohols having alkyl group with 1 to 4 carbon atoms include methanol, ethanol, 1-propanol, 2-propanol, 1-butanol etc., ethanol, 1-propanol and 2-propanol are preferable in consideration of safety. These alcohols can be used singly or in combination thereof. Combinations of 2 or more alcohols include, for example, a combination of ethanol and 1-propanol and a combination of ethanol and 2-propanol.

Although preferable examples of organic solvents in Group A or alcohols are illustrated above, the organic solvents in Group A or alcohols which can be used in the present invention are naturally not limited to those specifically illustrated.

The mixing ratio of the organic solvents in Group A and alcohols varies depending on which organic solvent or alcohol is used or which combination is used. However, the mixing ratio of the organic solvent in Group A: alcohol ranges from 10:90 to 99:1, more preferably from 40:60 to 90:10, most preferably from 60:40 to 80:20 by weight (hereinafter, "ratio" is expressed on a weight basis).

The cleaner for lithography according to the present invention can be used in lithography using any positive- or negative-working resists known in the art. Typical examples of the resists to which the cleaner for lithography of the present invention can be applied include positive-working resists, for example, resists consisting of, e.g., a quinone diazide photo-sensitizer and an alkali-soluble resin and chemically amplified resists, and negative-working resists, for example, resists containing polymeric compounds having photosensitive groups such as polyvinyl cinnamate, resists containing aromatic azide compounds, resists containing azide compounds consisting of cyclized rubber and bis-azide compounds, resists containing diazo resin, photopolymerizable compositions containing additionpolymerizable unsaturated compounds, chemically modified negative resists etc.

The above-described resist material consisting of a quinone diazide photo-sensitizer and an alkali-soluble resin is a preferable material to which the cleaner of the present invention is applied, and examples of the quinone diazide photo-sensitizer and alkali-soluble resin used in this resist material include quinone diazide photo-sensitizers such as 1,2-benzoquinonediazido-4-sulfonic acid, 1,2-naphthoquinone diazido-4-sulfonic acid, 1,2-naphtoquinonediazido-5-sulfonic acid, esters or amides of these sulfonic acids, and alkali-soluble resins such as polyvinyl phenol, polyvinyl alcohol, copolymers of acrylic acid or methacrylic acid, and novolak resin made e.g. from one or more phenols such as phenol, o-cresol, m-cresol, p-cresol, xylenol, etc. and aldehydes such as formaldehyde, paraformaldehyde, etc.

The chemically amplified resist is also a preferable resist to which the cleaner of the present invention is applied. The chemically amplified resist generates an acid upon exposure to radiation, and by chemical change due to the catalytic action of this acid, the solubility of the irradiated portion in a developing solution is altered to form a pattern, and for example, mention can be made of resists consisting of an acid-generating compound forming an acid upon exposure to radiation and an acid sensitive group-containing resin which is decomposed in the presence of an acid to form an alkali-soluble group such as phenolic hydroxyl group or carboxyl group, as well as resists consisting of an alkali-soluble resin, a cross-linking agent and an acid generator.

The cleaner for lithography according to the present invention can be applied to some compositions whose solvent is an organic solvent, out of known compositions for an anti-reflective coating which are applied for preventing a substrate from reflecting light upon exposure to light or for preventing interference of light from taking place in a resist layer.

Coating of the cleaner of the present invention and the method of forming a resist pattern are specifically as follows: First, a resist solution is applied by a known coating method such as spin coating method to a silicon substrate, a glass substrate, etc. pretreated as necessary. An anti-reflective coating is applied and formed before or after coating of the resist as necessary. If this coating is formed by e.g. spin coating method, beads of the resist or of the anti-reflective coating tend to be formed on the edge of the substrate, but the fluidity of beads can be promoted by spraying the cleaner of the present invention onto the beads on the rotating edge so that a resist layer or an anti-reflective coating with substantially uniform thickness can be formed the substrate. In addition, the resist or the anti-reflective coating having moved to the outer periphery or the back of the substrate can be removed by spraying the cleaner to that portion.

The resist coated on the substrate is pre-baked on e.g. a hot plate to remove the solvent, thereby forming a resist layer usually having a thickness of about 1 to 2.5 $\mu$m. Pre-baking is carried out at a temperature of usually 20 to 200° C. and preferably 50 to 150° C., although the temperature should be varied depending on the type of the solvent or resist used. Thereafter, the resist layer is exposed through a mask as necessary to radiation from known apparatuses for irradiation, such as high-pressure mercury lamp, metal halide lamp, ultra-high-pressure mercury lamp, KrF excimer laser, ArF excimer laser, soft X-ray irradiation apparatus, electron beam drawing apparatus etc., and after this radiation exposure, after-baking is conducted as necessary to improve development properties, resolution, pattern shape etc., followed by development to form a resist pattern. The development of the resist is conducted usually by using an alkaline developing solution. The alkaline developing solution used is a water or aqueous solution of sodium hydroxide, tetramethylammonium hydroxide (TMAH), etc.

After the resist pattern is formed, the resist pattern is used for predetermined treatment such as etching, plating, ion diffusion, etc. for forming circuit elements, and the resist pattern is removed by use of the cleaner of the present invention. After this removal, the cleaner of the present invention can be used for rinsing as necessary. Further, in cases where the solvent for removal of the resist is a water-insoluble solvent or an amine type organic solvent different from that of the present invention, the cleaner of the present invention is used for rinsing as necessary, followed by rinsing with purified water. Further, the cleaner of the present invention can also be used effectively for cleaning of coaters.

BEST MODE FOR CARRYING OUT THE INVENTION

Hereinafter, the present invention is described in more detail by reference to Examples and Comparative Examples, which however are not intended to limit the present invention.

EXAMPLE 1

100 parts by weight of the following novolak resin and 24 parts by weight of a quinone diazide photo sensitizer were dissolved at a solid content of 25% by weight in propylene glycol monomethyl ether acetate to prepare a resist. This resist was spin-coated such that a coating layer had a thickness of 2 $\mu$m on a 4-inch silicon substrate after pre-baking, and then pre-baked at 100° C. for 90 seconds on a direct hot plate to form a resist layer. In the following examples including this example, the resist layer was set to be thicker than that conventionally used, in order to conduct a solubility test.

Novolak resin: a polycondensate of m-cresol/p-cresol (6:4) and formaldehyde.

Quinone diazide photo-sensitizer: an esterified product of 2,3,4,4'-tetrahydroxybenzophenone and 1,2-naphtoquinonediazido-5-sulfonyl chloride.

The thus formed resist layer was examined on solubility in the following solubility test by use of cleaners 1-(1) to 1-(5) consisting of propylene glycol monomethyl ether acetate (PGMEA) and ethanol at different ratios as shown in Table 1, and the results in Table 1 were obtained.

(Solubility Test)

The substrate on which the resist layer was formed in the above method was immersed in 50 ml cleaner, and the time (dissolution time (sec.)) elapsed until the whole of the resist layer was dissolved and removed was determined by eyes, and the thickness (Å) of the resist layer was divided by the dissolution time to give a dissolution rate (Å/sec)

COMPARATIVE EXAMPLES 1 AND 2

The same procedure as in Example 1 was conducted except that the sole solvent of PGMEA (Comparative Example 1) or sole ethanol (Comparative Example 2) was used as the cleaner, and the results in Table 1 were obtained.

TABLE 1

| Cleaner Nos. | constitution of cleaner (ratio by weight) | dissolution rate (Å/sec) |
|---|---|---|
| 1-(1) | PGMEA*:ethanol = 9:1 | 7797 |
| 1-(2) | PGMEA:ethanol = 8:2 | 10770 |
| 1-(3) | PGMEA:ethanol = 7:3 | 18404 |
| 1-(4) | PGMEA:ethanol = 6:4 | 19916 |
| 1-(5) | PGMEA:ethanol = 5:5 | 13937 |
| Comparative Example 1 | PGMEA 100% | 2641 |
| Comparative Example 2 | ethanol 100% | insoluble |

*PGMEA: propylene glycol monomethyl ether acetate

As can be seen from Table 1, the dissolution rate is greatly increased by incorporating ethanol into PGMEA.

EXAMPLE 2

The same procedure as in Example 1 was conducted except that solutions consisting of PGMEA and 1-propanol at the ratios shown in cleaners Nos. 2-(1) to 2-(4) in Table 2 were used as the cleaner, and the results in Table 2 were obtained.

COMPARATIVE EXAMPLE 3

The same procedure as in Example 1 was conducted except that the sole solvent of 1-propanol was used as the cleaner, and the result in Table 2 was obtained.

TABLE 2

| Cleaner Nos. | constitution of cleaner (ratio by weight) | dissolution rate (Å/sec) |
| --- | --- | --- |
| 2-(1) | PGMEA*:1-propanol = 9:1 | 3318 |
| 2-(2) | PGMEA:1-propanol = 8:2 | 5224 |
| 2-(3) | PGMEA:1-propanol = 7:3 | 5672 |
| 2-(4) | PGMEA:1-propanol = 6:4 | 4843 |
| Comparative Example 1 | PGMEA 100% | 2641 |
| Comparative Example 3 | 1-propanol 100% | insoluble |

*PGMEA: propylene glycol monomethyl ether acetate

As is evident from Table 2, the dissolution rate is greatly increased in a similar manner to Example 1 by incorporating 1-propanol into PGMEA.

EXAMPLE 3

The same procedure as in Example 1 was conducted except that solutions consisting of PGMEA and 2-propanol at the ratios shown in cleaners Nos. 3-(1) to 3-(4) in Table 3 were used as the cleaner, and the results in Table 3 were obtained.

COMPARATIVE EXAMPLE 4

The same procedure as in Example 1 was conducted except that the sole solvent of 2-propanol was used as the cleaner, and the result in Table 3 was obtained.

TABLE 3

| Cleaner Nos. | constitution of cleaner (ratio by weight) | dissolution rate (Å/sec) |
| --- | --- | --- |
| 3-(1) | PGMEA*:2-propanol = 9:1 | 4543 |
| 3-(2) | PGMEA:2-propanol = 8:2 | 5128 |
| 3-(3) | PGMEA:2-propanol = 7:3 | 5659 |
| 3-(4) | PGMEA:2-propanol = 6:4 | 5350 |
| Comparative Example 1 | PGMEA 100% | 2641 |
| Comparative Example 4 | 2-propanol 100% | insoluble |

*PGMEA: propylene glycol monomethyl ether acetate

As is evident from Table 3, the dissolution rate is greatly increased in a similar manner to Examples 1 and 2 by incorporating 2-propanol into PGMEA.

EXAMPLE 4

The same procedure as in Example 1 was conducted except that solutions consisting of propylene glycol monomethyl ether (PGME) and ethanol at the ratios shown in cleaners Nos. 4-(1) to 4-(4) in Table 4 were used as the cleaner, and the results in Table 4 were obtained.

COMPARATIVE EXAMPLE 5

The same procedure as in Example 1 was conducted except that the sole solvent of PGME was used as the cleaner, and the result in Table 4 was obtained.

TABLE 4

| Cleaner Nos. | constitution of cleaner (ratio by weight) | dissolution rate (Å/sec) |
| --- | --- | --- |
| 4-(1) | PGME**:ethanol = 9:1 | 6321 |
| 4-(2) | PGME:ethanol = 8:2 | 9807 |
| 4-(3) | PGME:ethanol = 7:3 | 14514 |
| 4-(4) | PGME:ethanol = 6:4 | 10392 |
| Comparative Example 5 | PGME 100% | 4935 |
| Comparative Example 2 | ethanol 100% | insoluble |

**PGME: propylene glycol monomethyl ether

As is evident from Table 4, the dissolution rate is greatly increased by incorporating ethanol into PGME.

EXAMPLES 5 TO 10

The same procedure as in Example 1 was conducted except that solutions consisting of n-butyl acetate, ethyl lactate, 2-heptanone, ethoxypropionic acid ethyl ester, ethylene glycol ethyl ether acetate or methoxybutanol as organic solvent and ethanol as alcohol at the ratios shown in Examples 5 to 10 in Table 5 were used as the cleaner, and the results in Table 5 were obtained.

COMPARATIVE EXAMPLES 6 TO 11

The same procedure as in Example 1 was conducted except that the sole solvent of n-butyl acetate, ethyl lactate, 2-heptanone, ethoxypropionc acid ethyl ester, ethylene glycol ethyl ether acetate or methoxybutanol was used as the cleaner, and the results in Table 5 were obtained.

TABLE 5

| | constitution of cleaner (ratio by weight) | | dissolution rate (Å/sec) |
| --- | --- | --- | --- |
| Example 5 | n-butyl acetate:ethanol = 7:3 | | 5483 |
| Example 6 | ethyl lactate:ethanol = 7:3 | | 859 |
| Example 7 | 2-heptanone:ethanol = 7:3 | | 7550 |
| Example 8 | ethoxypropionic acid ethyl ester:ethanol = 7:3 | | 2371 |
| Example 9 | ethylene glycol ethyl ether acetate:ethanol = 7:3 | | 9142 |
| Example 10 | metoxybutanol:ethanol = 7:3 | | 3921 |
| Comparative Example 6 | n-butyl acetate | 100% | 4421 |
| Comparative Example 7 | ethyl lactate | 100% | 785 |
| Comparative Example 8 | 2-heptanone | 100% | 5940 |
| Comparative Example 9 | ethoxypropionic acid ethyl ester | 100% | 2204 |
| Comparative Example 10 | ethylene glycol ethyl ether acetate | 100% | 4592 |
| Comparative Example 11 | methoxybutanol | 100% | 1809 |
| Comparative Example 2 | ethanol | 100% | insoluble |

EXAMPLE 11

The same procedure as in Example 1 was conducted except that a mixture consisting of PGMEA, ethanol, and 1-propanol (7:2:1 by weight) was used as the cleaner, and the result in Table 6 was obtained.

COMPARATIVE EXAMPLE 12

The same procedure as in Example 1 was conducted except that a mixture of ethanol and 1-propanol (2:1 by weight) was used as the cleaner, and the result in Table 6 was obtained.

TABLE 6

| | constitution of cleaner (ratio by weight) | dissolution rate (Å/sec) |
|---|---|---|
| Example 11 | PGMEA*:ethanol:1-propanol = 7:2:1 | 15185 |
| Comparative Example 1 | PGMEA 100% | 2641 |
| Comparative Example 12 | ethanol:1-propanol = 2:1 | insoluble |

*PGMEA: propylene glycol monomethyl ether acetate

Any of the cleaners in the Examples were highly safe to the human body.

ADVANTAGE OF THE INVENTION

As described above, the cleaner for lithography of the present invention has significantly improved solubility towards the resist etc. to permit sufficient cleaning to be effected rapidly in a small amount of the cleaner, and is highly safe to the human body, as compared with conventional cleaners.

INDUSTRIAL APPLICABILITY

As described above, the cleaner for lithography according to the present invention is used in the steps of coating a resist, removing the resist, and cleaning the substrate after removal of the resist, and rinsing the substrate in the production of semiconductor integrated circuit elements.

What is claimed is:

1. A process for removing a resist from a substrate, comprising contacting said resist with a cleaning composition comprising a homogeneous solution consisting essentially of propylene glycol alkyl ether acetate, and at least one alcohol having an alkyl group of 2 to 3 carbon atoms.

2. The process of claim 1, wherein said propylene glycol alkyl ether acetate is at least one selected from propylene glycol monomethyl ether acetate and propylene glycol monoethyl ether acetate, and said alcohol is at least one selected from ethanol, 1-propanol and 2-propanol.

3. The process of claim 1, wherein the resist is derived from a composition comprising at least one alkali soluble resin and at least one quinone diazide photo-sensitizer.

4. The process of claim 3, wherein the alkali soluble resin is a member selected from the group consisting of novolak resins, polyvinyl phenol, polyvinyl alcohol, and copolymers of acrylic acid or methacrylic acid.

5. The process of claim 3, wherein the quinone diazide photosensitizer is selected from the group consisting of 1,2-benzoquinonediazido-4-sulfonic acid, 1,2-naphthoquinone diazido-4-sulfonic acid, 1,2-naphtoquinonediazido-5sulfonic acid, and esters or amides of these sulfonic acids.

6. The process of claim 1, wherein the substrate is a silicon substrate.

* * * * *